United States Patent
Park et al.

(10) Patent No.: US 8,836,001 B2
(45) Date of Patent: *Sep. 16, 2014

(54) SEMICONDUCTOR DEVICE HAVING BURIED BIT LINE, AND METHOD FOR FABRICATING THE SAME

(75) Inventors: Eun-Shil Park, Gyeonggi-do (KR); Ju-Hyun Myung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/494,333

(22) Filed: Jun. 12, 2012

(65) Prior Publication Data

US 2013/0240965 A1   Sep. 19, 2013

(30) Foreign Application Priority Data

Mar. 19, 2012 (KR) .................. 10-2012-0027834

(51) Int. Cl.
*H01L 27/08* (2006.01)
*H01L 29/94* (2006.01)

(52) U.S. Cl.
USPC ........... 257/296; 257/329; 257/306; 257/330; 257/302; 438/770; 438/253; 438/268

(58) Field of Classification Search
USPC .......... 257/296, 329, 306, 330, 302; 438/770, 438/253, 268
See application file for complete search history.

(56) References Cited

U.S. PATENT DOCUMENTS

| | | | | |
|---|---|---|---|---|
| 5,429,973 A * | 7/1995 | Hong | | 438/278 |
| 6,355,520 B1 * | 3/2002 | Park et al. | | 438/253 |
| 7,736,969 B2 | 6/2010 | Abbott et al. | | |
| 8,102,008 B2 * | 1/2012 | Wells | | 257/374 |
| 8,169,020 B2 * | 5/2012 | Cho | | 257/329 |
| 8,309,416 B2 * | 11/2012 | Park et al. | | 438/253 |
| 8,350,323 B2 * | 1/2013 | Mikasa | | 257/330 |
| 8,557,662 B2 * | 10/2013 | Lee | | 438/270 |
| 2006/0240678 A1 * | 10/2006 | Jang et al. | | 438/770 |
| 2007/0082448 A1 * | 4/2007 | Kim et al. | | 438/268 |
| 2010/0090263 A1 * | 4/2010 | Kunkel et al. | | 257/296 |
| 2010/0301407 A1 * | 12/2010 | Sung | | 257/329 |
| 2011/0073925 A1 * | 3/2011 | Park et al. | | 257/306 |
| 2011/0143508 A1 * | 6/2011 | Kim et al. | | 438/270 |
| 2012/0012926 A1 * | 1/2012 | Ha et al. | | 257/330 |
| 2012/0171846 A1 * | 7/2012 | Hwang | | 438/478 |
| 2013/0001663 A1 * | 1/2013 | Abbott et al. | | 257/296 |
| 2013/0105872 A1 * | 5/2013 | Kim et al. | | 257/296 |
| 2013/0126954 A1 * | 5/2013 | Wu et al. | | 257/296 |
| 2013/0146958 A1 * | 6/2013 | Kim et al. | | 257/302 |
| 2013/0161710 A1 * | 6/2013 | Ji et al. | | 257/296 |

FOREIGN PATENT DOCUMENTS

KR   1020110078022   7/2011
KR   1020110101876   9/2011

* cited by examiner

*Primary Examiner* — Fernando L Toledo
*Assistant Examiner* — Mohammed Shamsuzzaman
(74) *Attorney, Agent, or Firm* — IP & T Group LLP

(57) ABSTRACT

A method for fabricating a semiconductor device includes forming at least one body having two sidewalls by vertically etching a semiconductor substrate, forming a protective layer having open parts that expose portions of the both sidewalls of the body, forming a buffer layer that fills the open parts, and forming a buried bit line in the body by siliciding the buffer layer and a portion of the body between the buffer layer.

11 Claims, 14 Drawing Sheets

SEMICONDUCTOR DEVICE HAVING BURIED BIT LINE, AND METHOD FOR FABRICATING THE SAME

CROSS-REFERENCE TO RELATED APPLICATIONS

The present application claims priority of Korean Patent Application No. 10-2012-0027834, filed on Mar. 19, 2012, which is incorporated herein by reference in its entirety.

BACKGROUND

1. Field

Exemplary embodiments of the present invention relate to a semiconductor device, and more particularly, to a semiconductor device having buried bit lines and a fabricating method thereof.

2. Description of the Related Art

Most semiconductor devices include transistors. For example, in a memory device such as a DRAM, a memory cell includes a MOSFET. A MOSFET typically includes source/drain regions formed in the surface of a semiconductor substrate, and a planar channel is formed between the source region and the drain region. Such a MOSFET is referred to as a planar channel transistor.

As improvements in degree of integration and performance of a memory device are continuously demanded, a technology for fabricating a MOSFET is faced with physical limitations. For example, as the size of a memory cell shrinks, the size of a MOSFET shrinks, and thus the channel length of the MOSFET may be shortened as well. If the channel length of a MOSFET is shortened, data maintaining properties are likely to deteriorate, thereby degrading the characteristics of the memory device.

In consideration of these features, a vertical channel transistor has been suggested in the art. In the vertical channel transistor (VCT), a source region and a drain region are formed on the both ends of a pillar. Any one of the source region and the drain region is connected with a bit line. The bit line is formed by being buried in a trench defined between pillars, and accordingly, is referred to as a buried bit line (BBL).

Two memory cells each including a vertical channel transistor (VCT) are adjacent to one buried bit line (BBL). Therefore, the buried bit line (BBL) is formed in a space (trench) between cells, and an OSC (one-side-contact) process is performed to connect one cell with one buried bit line (BBL). The OSC process is a process for allowing each buried bit line (BBL) to be brought into contact with one of two adjacent cells. Thus, the OSC process is also referred to as a single-side-contact (SSC) process. Generally, in a memory device such as a DRAM which adopts a planar channel transistor, in order to connect a planar channel transistor with a bit line, a contact plug of a high aspect ratio is to be formed. However, in the case of adopting a vertical channel transistor and a buried bit line, since the vertical channel transistor and the buried bit line may be brought into direct contact with each other, a contact plug process may not be performed. Hence, because the bit line is not to be connected with a contact plug, the parasitic capacitance of the bit line may be reduced.

FIG. 1 is a cross-sectional view illustrating a buried bit line formed according to the conventional art.

Referring to FIG. 1, a plurality of bodies 14, which are separated by trenches 13, are formed on a semiconductor substrate 11. The bodies 14 are formed through etching using a hard mask layer 12. A protective layer 15 is formed on the sidewalls of the bodies 14 and on the surfaces of the trenches 13. Open parts 17 are defined in the protective layer 15 through an OSC process. Each open part 17 exposes one sidewall of each body 14. Buried bit lines 16 are formed to partially fill the trenches 13. The buried bit lines 16 are connected with the bodies 14 through the open parts 17. Each buried bit line 16 is connected with one of two adjacent bodies 14. While not shown in the drawing, the upper portion of each body 14 includes a pillar in which source/drain regions and a channel of a vertical channel transistor are formed.

As can be seen from FIG. 1, in order to connect each buried bit line 16 to the sidewall of one of the adjacent bodies 14, an OSC process is adopted. In order to realize the OSC process, various methods such as a liner layer and a tilt ion implantation process, an OSC mask process and the like have been proposed.

However, these methods fail to form a uniform and reproducible OSC structure due to difficulties in processing. Also, as the distance between adjacent buried bit lines 16 becomes narrow in high integration, parasitic capacitance $C_B$ between adjacent buried bit lines 16 increases. Since the buried bit lines 16 are brought into contact with the bodies 14, the parasitic capacitance $C_B$ between buried bit lines 16 is substantially capacitance between the body 14 and the buried bit line 16. Accordingly, because the distance between adjacent buried bit lines 16 becomes narrow, the parasitic capacitance $C_B$ increases markedly.

If the parasitic capacitance $C_B$ between buried bit lines increases in this way, a semiconductor device may not operate properly.

SUMMARY

Exemplary embodiments of the present invention are directed to a semiconductor device having buried bit lines, which may reduce the parasitic capacitance between adjacent buried bit lines, and a method for fabricating the same.

In accordance with an exemplary embodiment of the present invention, a method for fabricating a semiconductor device includes forming at least one body having two sidewalls by etching a semiconductor substrate, forming a protective layer having open parts that expose portions of the both sidewalls of the body, forming a buffer layer that fills the open parts, and forming a buried bit line in the body by siliciding the buffer layer and a portion of the body between the buffer layer.

In accordance with another embodiment of the present invention, a method for fabricating a semiconductor device includes etching a silicon substrate and forming a plurality of silicon bodies that each have a burial region, forming a protective layer having open parts that expose both sidewalls of the burial regions of the silicon bodies, forming a silicon-containing buffer layer that fills the open parts, forming a metal-containing layer over entire surfaces of the silicon bodies including the silicon-containing buffer layer, forming a metal silicide layer in the burial regions of the silicon bodies by fully siliciding the silicon-containing buffer layer and the burial regions, removing the metal-containing layer, and forming a dielectric layer that gap-fills spaces between the plurality of silicon bodies.

In accordance with still another embodiment of the present invention, a semiconductor device includes at least one body formed in a semiconductor substrate and having two sidewalls, a protective layer having open parts that expose both sidewalls of a lower portion of the body, and a bit line buried in the lower portion of the body and protruding from the both sidewalls of the body to be filled in the open parts.

DETAILED DESCRIPTION

Figure 1:
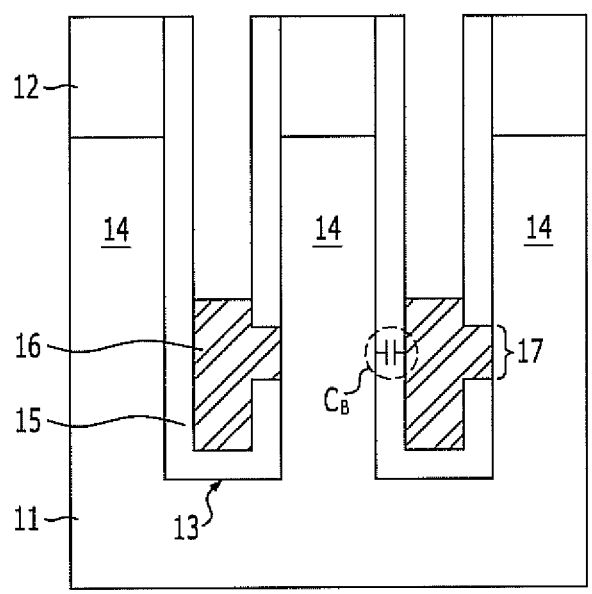
FIG. 1 is a cross-sectional view illustrating a buried bit line formed according to the conventional art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
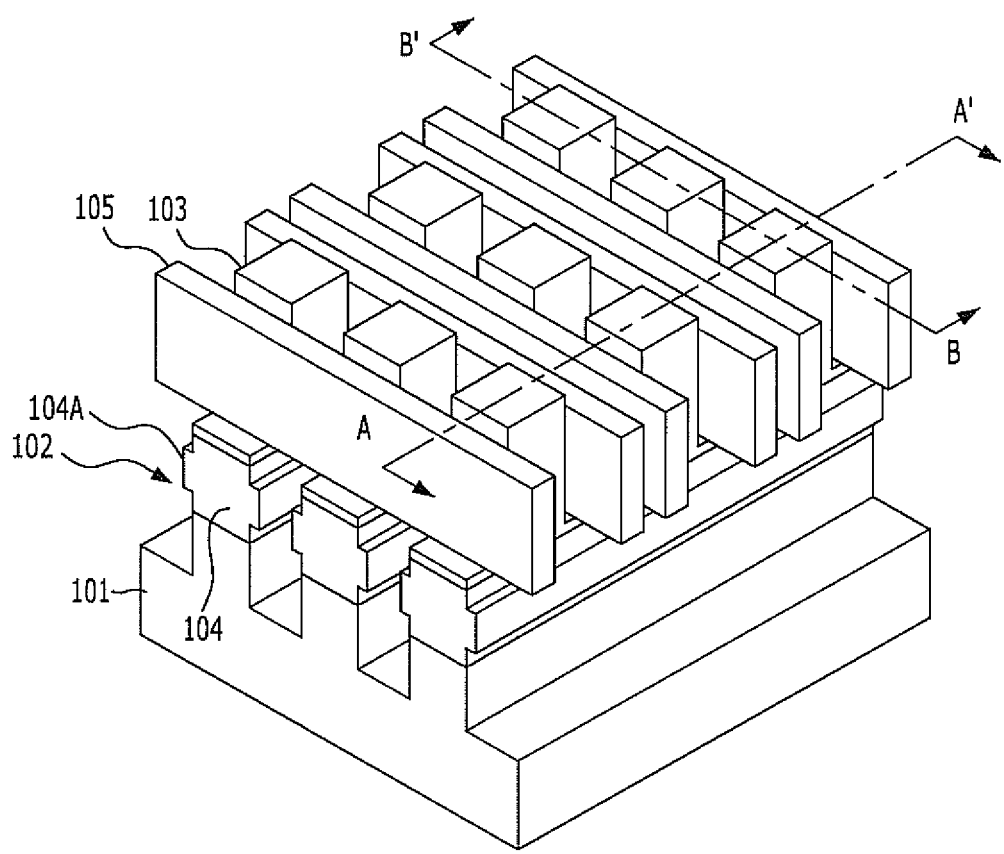
FIG. 2 is a perspective view illustrating a semiconductor device having buried bit lines in accordance with an exemplary embodiment of the present invention.
Figure 3A:
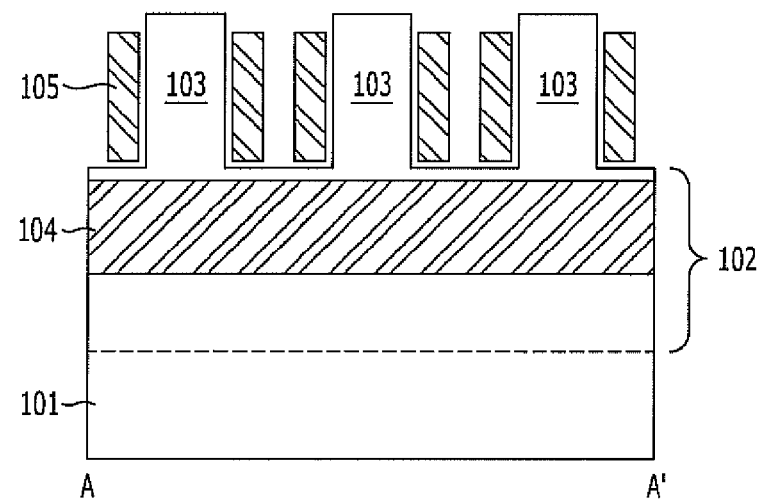
FIG. 3A is a cross-sectional view taken along the line A-A' shown in FIG. 2.
Figure 3B:
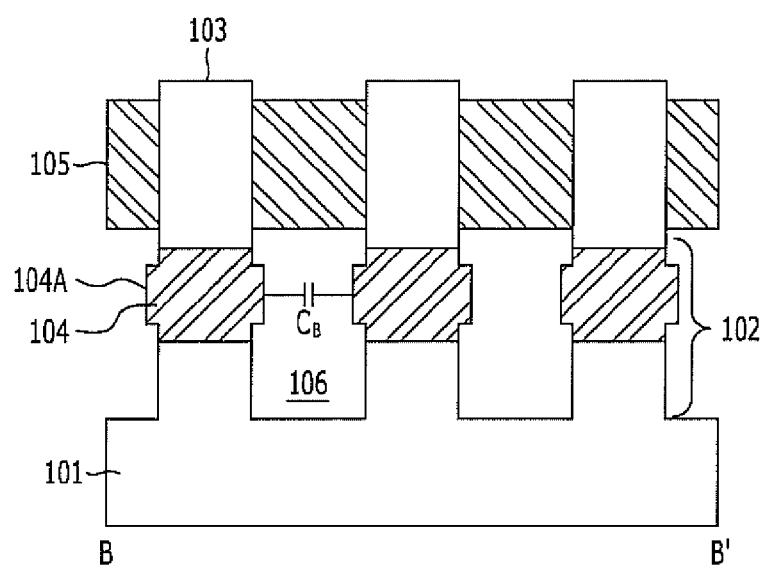
FIG. 3B is a cross-sectional view taken along the line B-B' shown FIG. 2.

FIG. 2 is a perspective view illustrating a semiconductor device having buried bit lines in accordance with an embodiment of the present invention, FIG. 3A is a cross-sectional view taken along the line A-A' of FIG. 2, and FIG. 3B is a cross-sectional view taken along the line B-B' of FIG. 2.

Referring to FIGS. 2, 3A and 3B, a semiconductor device includes buried bit lines 104, pillars 103 and word lines 105. A plurality of bodies 102 and a plurality of pillars 103 are formed on a semiconductor substrate 101. The semiconductor substrate 101, the bodies 102 and the pillars 103 may be provided to have an integral structure with one another. In embodiments, the semiconductor substrate 101, the bodies 102 and the pillars 103 may be formed by etching a silicon-containing substance. The plurality of pillars 103 are formed on each body 102. The plurality of bodies 102 are formed to extend in one direction on the semiconductor substrate 101 and are separated from one another. Each body 102 has a linear form. The bodies 102 may be formed to protrude from the semiconductor substrate 101, and the pillars 103 may be formed to protrude from the bodies 102. For example, the semiconductor substrate 101 and the bodies 102 may be orthogonal to each other, and the bodies 102 and the pillars 103 may be orthogonal to each other. The plurality of pillars 103 are formed on the bodies 102 to be separated from one another. The plurality of pillars 103 may have the layout of an array.

The semiconductor substrate 101 includes a monocrystalline silicon-containing substance. For example, the semiconductor substrate 101 may include a silicon substrate, a silicon germanium substrate, or an SOI (silicon on insulator) substrate. Because the bodies 102, the pillars 103 and the semiconductor substrate 101 may include the same substance, the bodies 102 and the pillars 103 include a silicon-containing substance. The bodies 102 and the pillars 103 include silicon or silicon germanium.

Each pillar 103 has a structure in which source/drain regions and a channel region of a vertical channel transistor are formed. For example, each pillar 103 may include a first source/drain region, a second source/drain region and a vertical channel region. Any one of the first source/drain region and the second source/drain region may be connected with each buried bit line 104. The other of the first source/drain region and the second source/drain region may be connected with a capacitor. The first source/drain region, the vertical channel region and the second source/drain region may be connected with one another in the vertical direction. The first source/drain region and the second source/drain region may form an NPN junction or a PNP junction with the vertical channel region. For example, in the case that the first source/drain region and the second source/drain region are doped with impurities of a first conductivity type, the vertical channel region may be doped with impurities of a second conductivity type opposite to the first conductivity type. For example, when the impurities of the first conductivity type are N type impurities, the impurities of the second conductivity type include P type impurities. Conversely, when the impurities of the first conductivity type are P type impurities, the impurities of the second conductivity type include N type impurities. In the event that the vertical channel transistor is an NMOSFET, the first source/drain region, the vertical channel region and the second source/drain region may form an NPN junction.

The buried bit lines 104 are formed in the bodies 102. Both sidewalls of the buried bit lines 104 may include projecting parts 104A which project outward. The buried bit lines 104 may extend in a first direction. The buried bit lines 104 include a metallic substance. The buried bit lines 104 may include a metal silicide. The metal silicide is substance of which resistance is lower than that of polysilicon. Due to this fact, the buried bit lines 104 have low resistance. The buried bit lines 104 may be formed through a silicidation process. Further, the buried bit lines 104 may be formed through a full silicidation process. The full silicidation process is a process for fully siliciding a silicon-containing substance, that is, a process for changing the silicon-containing substance to be a silicide. The buried bit lines 104 may be formed as a metal silicide, which includes a near-noble metal or a refractory metal, such as a titanium silicide ($TiSi_x$), a tungsten silicide ($WSi_x$), a cobalt silicide ($CoSi_x$) and a nickel silicide ($NiSi_x$). The metal silicide may be obtained by forming a conductive layer through a sputtering process, a chemical vapor deposition (CVD) process or an atomic layer deposition (ALD) process and then performing a silicidation process. The conductive layer may include a pear-noble metal or a refractory metal. Adjacent buried bit lines 104 are separated from each other by the trench 106. While not shown in a drawing, a dielectric layer may be filled in the trench 106 between adjacent buried bit lines 104. Here, the dielectric layer may include an oxide.

The word lines 105 are formed on the sidewalls of the pillars 103 to extend along the sidewalls of the pillars 103. The word lines 105 are referred to as vertical word lines. Since the word lines 105 are formed on both sidewalls of the pillars 103, a double word line structure may be formed. Even though the double word line structure is formed, ends of the respective word lines may be connected with each other. Since the pillars 103 serve as regions where channels are formed, vertical channels are formed by the word lines 105. By these facts, vertical channel transistors each including a first source/drain, a vertical channel and a second source/drain are formed. The word lines 105 may extend in a second direction perpendicular to the first direction (the extending direction of the buried bit lines 104). The word lines 105 include a metallic substance. The word lines 105 may include a titanium nitride (TiN) or the stack (WN/W) of a tungsten nitride and tungsten. The word lines 105 and the buried bit lines 104 may be formed to be separated from each other. To this end, a dielectric substance may be additionally formed between the word lines 105 and the buried bit lines 104. The dielectric substance may include a silicon oxide, etc. While not shown, the word lines 105 may extend in the second direction perpendicular to the first direction (the extending direction of the buried bit lines 104) while surrounding the pillars 103.

As described above, the buried bit lines 104 are formed in the bodies 102. Accordingly, adjacent buried bit lines 104 are sufficiently separated from one another by the trenches 106, and thus parasitic capacitance $C_B$ between adjacent bit lines 104 decreases.

Figure 4A:
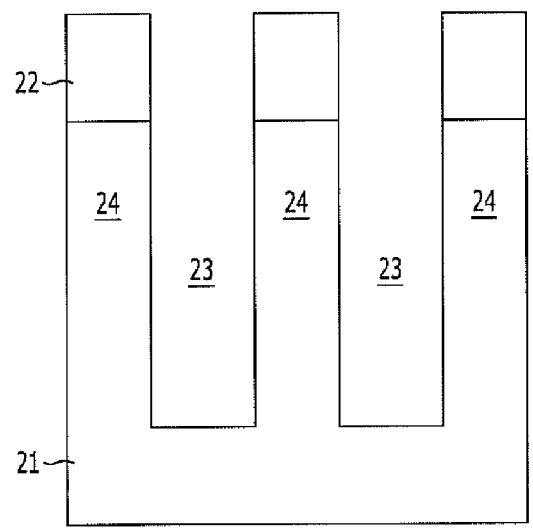
FIGS. 4A to 4O are cross-sectional views illustrating a method for forming buried bit lines in accordance with the exemplary embodiment of the present invention.
Figure 4B:
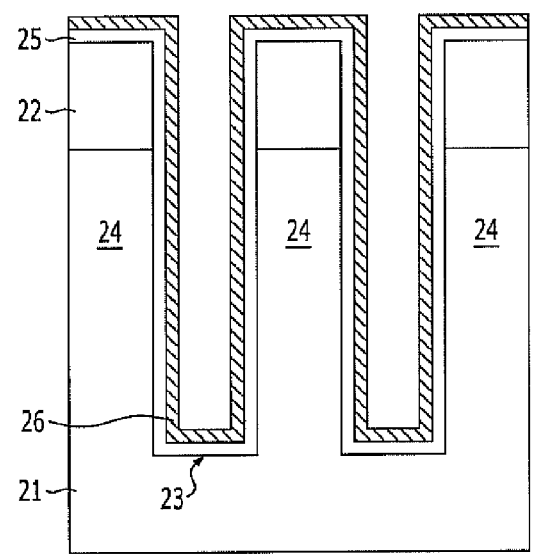
Figure 4C:
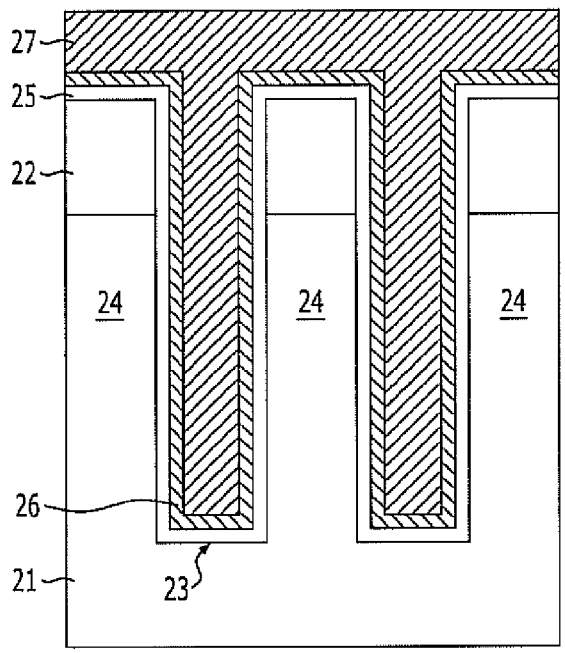
Figure 4D:
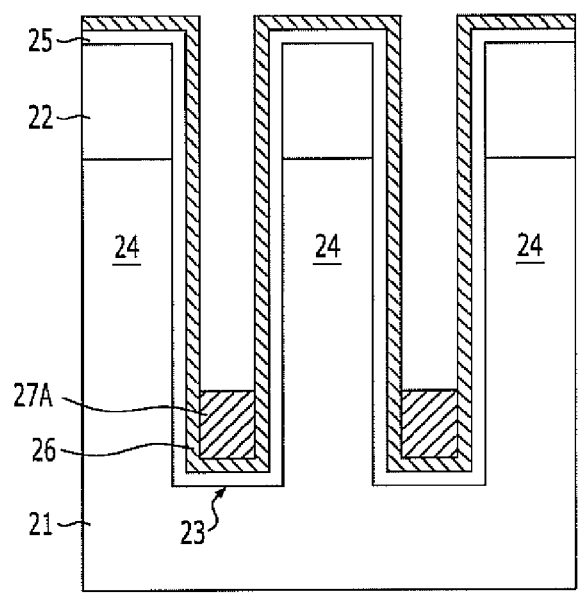
Figure 4E:
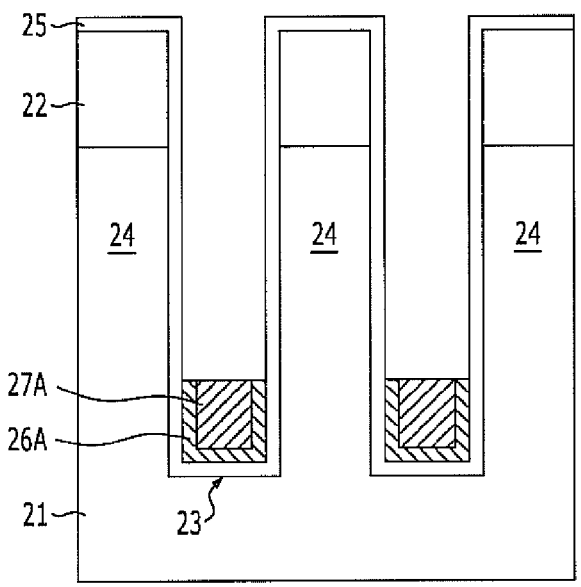
Figure 4F:
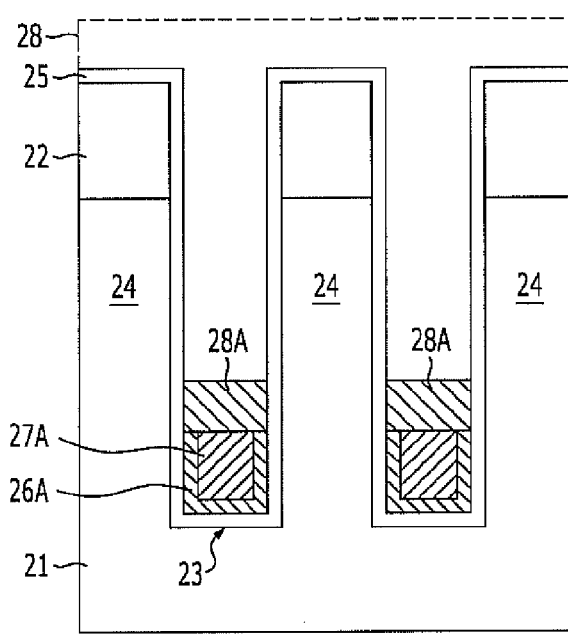
Figure 4G:
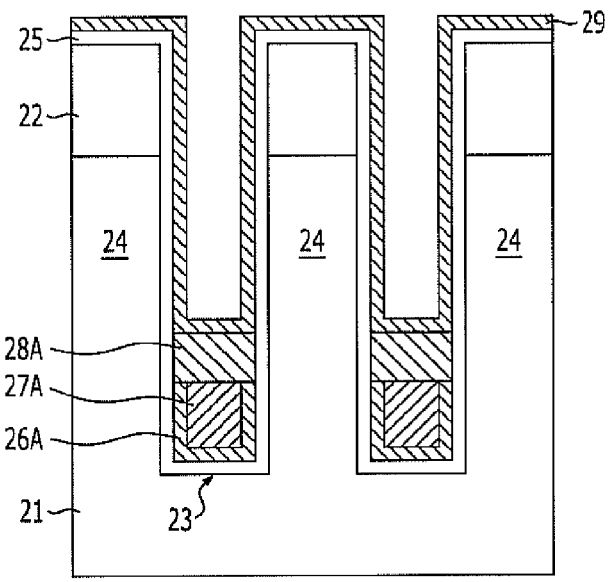
Figure 4H:
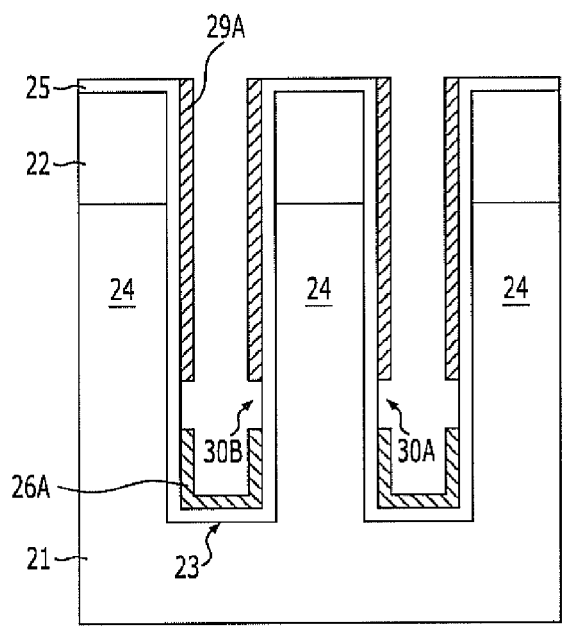
Figure 4I:
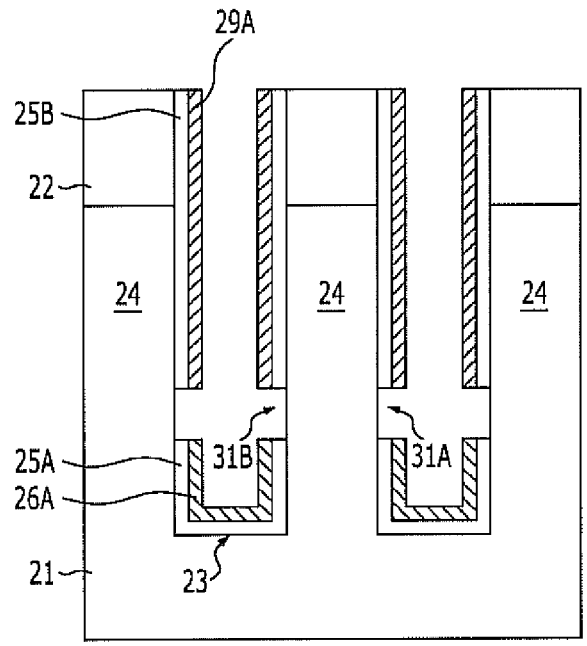
Figure 4J:
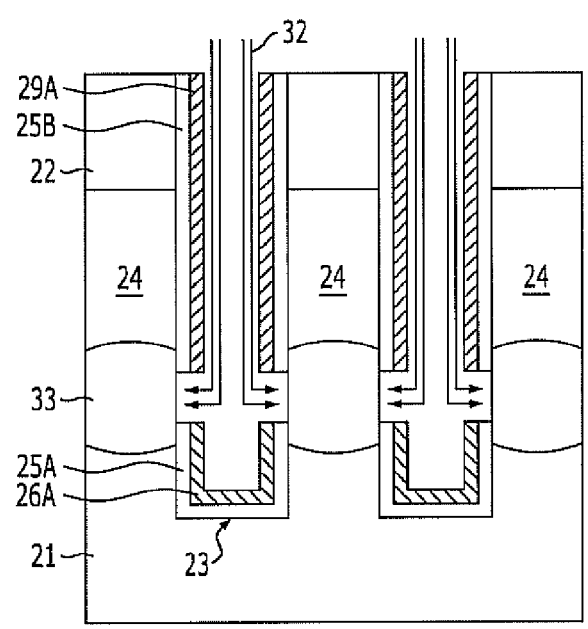
Figure 4K:
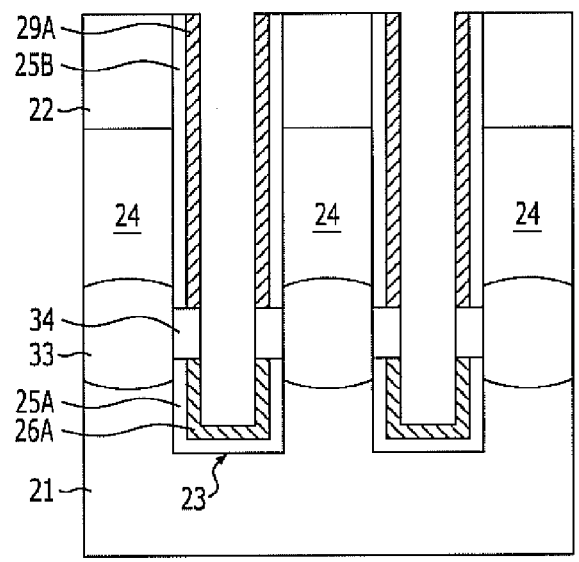
Figure 4L:
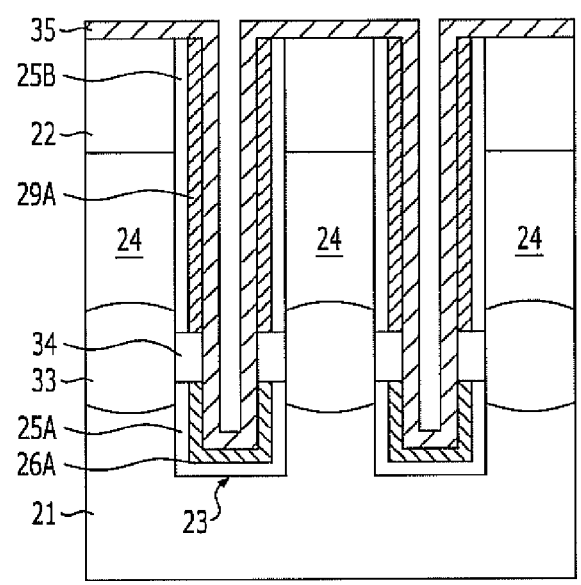
Figure 4M:
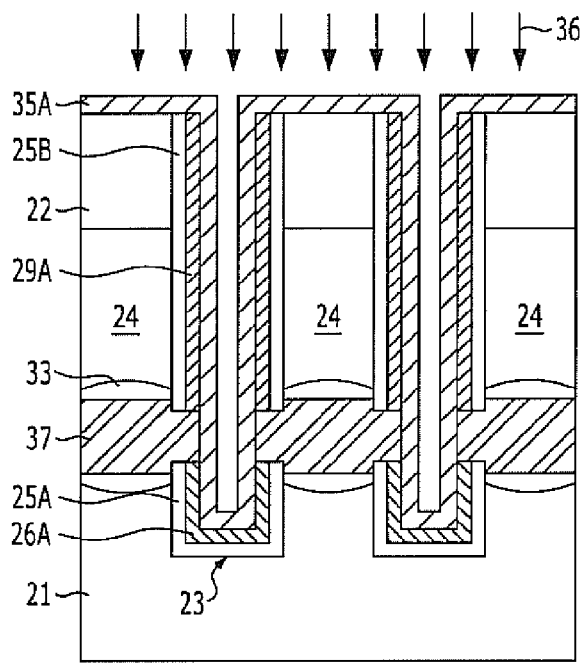
Figure 4N:
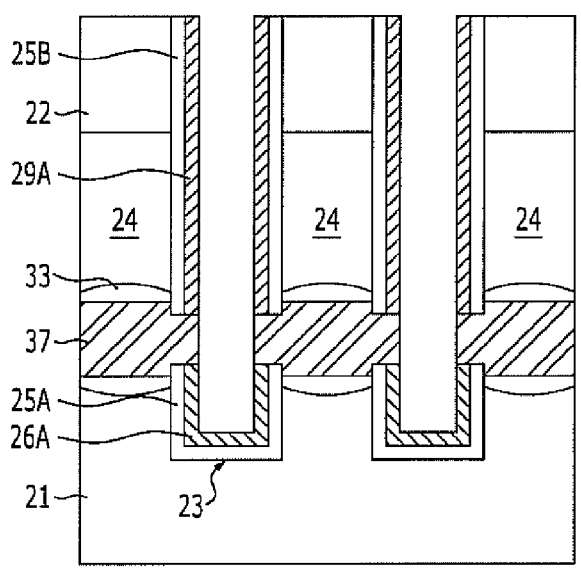
Figure 4O:
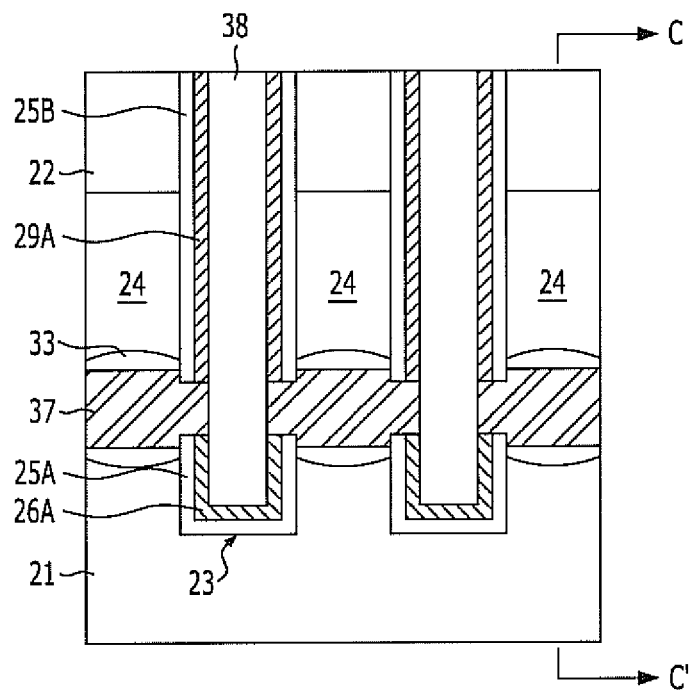

FIGS. 4A to 4O are cross-sectional views illustrating a method for forming buried bit lines in accordance with the embodiment of the present invention.

Referring to FIG. 4A, a hard mask layer 22 is formed on a semiconductor substrate 21. The semiconductor substrate 21 includes a monocrystalline silicon-containing substance. For example, the semiconductor substrate 21 includes a silicon substrate or a silicon germanium substrate. The hard mask layer 22 includes a nitride layer. The hard mask layer 22 may have a multi-layered structure including an oxide layer and a nitride layer. For example, the hard mask layer 22 may be formed by sequentially stacking a hard mask nitride layer and a hard mask oxide layer. Also, the hard mask layer 22 may be formed by stacking a hard mask nitride layer, a hard mask oxide layer, a hard mask silicon oxynitride layer and a hard mask carbon layer. In the case that the hard mask layer 22 includes a hard mask nitride layer, a pad oxide layer may be additionally formed between the semiconductor substrate 21 and the hard mask layer 22. The pad oxide layer may alleviate stress induced on the semiconductor substrate 21 while forming the hard mask layer 22. The pad oxide layer may include a silicon oxide. The hard mask layer 22 is formed using a photoresist pattern which is not illustrated in the drawing. The hard mask layer 22 is formed to extend in a first direction. The hard mask layer 22 may be used to form a plurality of pillar structures. The plurality of pillar structures are used in formation of vertical channel transistors. For example, each vertical channel transistor may include a source region, a drain region and a channel region. The channel region may be positioned between the source region and the drain region and may protrude from the surface of the semiconductor substrate 21. The vertical channel transistor has improved degree of integration and improved operational characteristics, and accordingly, may be applied to the memory cell of a memory device.

A trench etching process is performed using the hard mask layer 22 as an etch mask. For example, by etching the semiconductor substrate 21 by a given depth using the hard mask layer 22 as an etch barrier, bodies 24 are formed. The bodies 24 are separated from one another by trenches 23. Each body 24 has two sidewalls. The trench etching process includes anisotropic etching. In the case that the semiconductor substrate 21 is a silicon substrate, anisotropic etching uses a chlorine-based gas such as $Cl_2$ and $CCl_4$, a bromide-based gas such as HBr, or a mixed gas of $O_2$ gas. The plurality of bodies 24 are separated from one another by the trenches 23. The plurality of bodies 24 are formed to protrude from the surface of the semiconductor substrate 21. When viewed from the top, the bodies 24 have linear forms which are separated from one another by the trenches 23.

By forming the bodies 24 in this way, a plurality of structures including the bodies 24 and the hard mask layer 22 are formed. The plurality of structures are separated from one another by the trenches 23. As described below, the upper portions of the bodies 24 are subsequently etched and become pillars.

Referring to FIG. 4B, protective layers with different etching selectivities are formed on the entire surface of the structure formed with the bodies 24. The protective layers may be formed by stacking a first protective layer 25 and a second protective layer 26. The first protective layer 25 and the second protective layer 26 may include an oxide layer, a nitride layer, a silicon layer, Ti, Co, Ru, Al, Cu, W and mixtures thereof. Because the first protective layer 25 and the second protective layer 26 have different etching selectivities, different substances are selected to form the first protective layer 25 and the second protective layer 26. For example, if an oxide layer is used as the first protective layer 25, a substance having a different etching selectivity from the oxide layer is selected to form the second protective layer 26. if the first protective layer 25 is an oxide layer, a nitride layer may be used as the second protective layer 26.

Referring to FIG. 4C, a first sacrificial layer 27 is formed on the entire surface of a resultant structure including the second protective layer 26 in such a way as to gap-fill the trenches 23 between the bodies 24. A substance having a different etching selectivity from the first and second protective layers 25 and 26 may be used to form the first sacrificial layer 27. The first sacrificial layer 27 may include an oxide layer, a nitride layer, a silicon layer, Ti, Co, Ru, Al, Cu, W and mixtures thereof. Here, while substances used as the first and second protective layers 25 and 26 may be repeatedly used as the first sacrificial layer 27, a different substance is used to have a different etching selectivity. For example, as the first sacrificial layer 27, a silicon layer may be used.

Referring to FIG. 4D, the first sacrificial layer 27 is planarized. The planarization of the first sacrificial layer 27 includes a CMP (chemical mechanical polishing) process. Successively, an etch-back process is performed. By the etch-back process, first sacrificial layer patterns 27A which are recessed are formed. During the etch-back process, the second protective layer 26 is not etched since it has an etching selectivity different from that of the first sacrificial layer 27.

Referring to FIG. 4E, portions of the second protective layer 26 which are exposed by the recessed first sacrificial layer patterns 27A are selectively removed. By this fact, second protective layer patterns 26A with the same height as the first sacrificial layer patterns 27A are formed. In order to remove the second protective layer 26, wet etching or dry etching may be adopted.

Referring to FIG. 4F, a second sacrificial layer 28 is formed on the entire surface of the resultant structure formed with the second protective layer patterns 26A. The second sacrificial layer 28 gap-fills the trenches 21 The second sacrificial layer 28 may be formed of a substance with a different etching selectivity from the first protective layer 25. The second sacrificial layer 28 may include an oxide layer, a nitride layer, a silicon layer, Ti, Co, Ru, Al, Cu, W and mixtures thereof. Here, while substances used as the first protective layer 25 may be repeatedly used as the second sacrificial layer 28, a different substance is used to have a different etching selectivity. For example, according to the exemplary embodiment, as the second sacrificial layer 28, a silicon layer may be used.

Then, the second sacrificial layer 28 is planarized. The planarization of the second sacrificial layer 28 includes a CMP (chemical mechanical polishing) process. Successively, an etch-back process is performed. By the etch-back process, second sacrificial layer patterns 28A which are recessed are formed. During the etch-back process, the first protective layer 25 is not etched since it has an etching selectivity different from that of the second sacrificial layer 28.

Referring to FIG. 4G, a third protective layer 29 is formed on the entire surface of the resultant structure including the second sacrificial layer patterns 28A. The third protective layer 29 may include an oxide layer, a nitride layer, a silicon layer, Ti, Co, Ru, Al, Cu, W and mixtures thereof. The third protective layer 29 may be formed of a substance with a different etching selectivity from the first protective layer 25. Therefore, different substances are selected as the first protective layer 25 and the third protective layer 29. For example, if an oxide layer is used as the first protective layer 25, a substance with a different etching selectivity from the oxide layer is selected as the third protective layer 29. If the oxide layer is used as the first protective layer 25, a nitride layer may be used as the third protective layer 29.

Referring to FIG. 4H, the third protective layer 29 is selectively etched through spacer etching. Therefore, third protective layer patterns 29A are formed. The third protective layer patterns 29A have the forms of spacers which cover the sidewalls of the bodies 24 and the hard mask layer 22. The third protective layer patterns 29A cover the sidewalls of the bodies 24 and the hard mask layer 22 on the second sacrificial layer patterns 28A. The third protective layer patterns 29A cover the first protective layer 25. By the third protective layer patterns 29A, the underlying second sacrificial layer patterns 28A are exposed.

Next, the second sacrificial layer patterns 28A are removed. The second sacrificial layer patterns 28A are removed using dry etching or wet etching.

As the second sacrificial layer patterns 28A are removed in this way, preliminary open parts 30A and 30B are formed between the third protective layer patterns 29A and the second protective layer patterns 26A. The preliminary open parts 30A and 30B expose portions of the first protective layer 25. The preliminary open parts 30A and 30B are in the forms of lines which extend along the sidewalls of the bodies 24. In particular, the preliminary open parts 30A and 30B are on both sidewalls of the bodies 24.

Referring to FIG. 4I, the portions of the first protective layer 25 which are exposed through the preliminary open parts 30A and 30B are selectively removed. By this fact, open parts 31A and 31B are formed. The sidewalls of the bodies 24 are covered by first protective layer patterns 25A and 25B, the second protective layer patterns 26A and the third protective layer patterns 29A having the open parts 31A and 31B. When viewed from the positions of the open parts 31A and 31B, the lower sidewalls of the bodies 24 are covered by the first protective layer patterns 25A and the second protective layer patterns 26A, and the upper sidewalls of the bodies 24 are covered by the first protective layer patterns 25B and the third protective layer patterns 29A. When forming the open parts 31A and 31B, portions of the first protective layer 25 which are formed on the hard mask layer 22 may be simultaneously removed.

The open parts 31A and 31B may be in the forms of lines which extend along the sidewalls of the bodies 24. Specifically, the open parts 31A and 31B are simultaneously formed on both sidewalls of the bodies 24. Thus, a series of processes for forming the open parts 31A and 31B are referred to as a double-side-contact (DSC) process. The double-side-contact (DSC) process is contrasted with the conventional OSC process. While the OSC process is a process for exposing one of both sidewalls of each body, the double-side-contact (DSC) process is a process for exposing both sidewalls of each body 24.

The double-side-contact (DSC) process as described above is simple unlike the OSC process. Also, tilt ion implantation and an OSC mask may not be used. In particular, the height of the open parts 31A and 31B may be uniformized.

Referring to FIG. 4J, plasma doping 32 is performed. At this time, portions of the sidewalls of the bodies 24 which are exposed through the open parts 31A and 31B are doped. Accordingly, first source/drain regions 33 are formed. The first source/drain regions 33 become source regions or drain regions of vertical channel transistors.

The plasma doping 32 is a method in which a doping source is excited to a plasma state and dopant ions in the excited plasma are implanted into a target object. At this time, by applying a bias voltage to the target object, the dopant ions in the plasma may be doped all at once to the entire surface of the target object. Here, the bias energy is also referred to as doping energy.

The plasma doping 32 is performed by adjusting doping energy, a doping dose and a doping source.

The doping source is a substance which contains a dopant to be doped to the first source/drain regions 33. The doping source includes a dopant gas. The doping source uses a dopant gas containing arsenic (As), phosphorus (P), and so forth. For example, the doping source includes $AsH_3$ or $PH_3$. Arsenic (As) and phosphorus (P) are known as N-type dopants. Also, as the doping source, a dopant gas containing boron (B) may be used. Boron is known as a P-type dopant.

The doping energy is a bias voltage applied to the semiconductor substrate 21. The doping energy is applied to the bodies 24 as well. Accordingly, the plasma doping 32 may be performed in a lateral direction. Further, the plasma doping 32 in the lateral direction may be performed by impingement of ions in the excited plasma.

The doping dose indicates an implantation amount of the dopant. The doping dose is set to $1\times10^{15} \sim 1\times10^{17}$ atoms/cm$^2$. By performing the plasma doping 32 using the doping dose with such a range, the dopant doped to the first source/drain regions 33 has a doping concentration equal to or greater than $1\times10^{20}$ atoms/cm$^3$.

For the plasma doping 32, a gas for exciting plasma may be flowed. The gas for exciting plasma includes argon (Ar), helium (He), etc.

As described above, since the plasma doping 32 may be performed without a tilt angle, doping may be performed without experiencing a shadow effect by a surrounding structure. Due to this fact, the first source/drain regions 33 may be formed at desired positions. Furthermore, by controlling the doping energy, the first source/drain regions 33 may be simultaneously formed through both open parts 31A and 31B. Accordingly, the first source/drain regions 33 which are simultaneously formed through both open parts 31A and 31B may be connected with each other and may form one region.

As another method for forming the first source/drain regions 33, doped polysilicon in situ doped with a dopant may be used. For example, by performing annealing after gap-filling the doped polysilicon, the dopant in the doped polysilicon may be diffused into the bodies 24.

Referring to FIG. 4K, a buffer layer 34 is formed to fill the open parts 31A and 31B. Here, the buffer layer 34 may include a silicon-containing substance. The buffer layer 34 includes a silicon-containing substance capable of silicidation. For example, the buffer layer 34 may include a silicon layer.

The buffer layer 34 may be formed through selective epitaxial growth (SEG). Since the substance of the bodies 24 is monocrystalline silicon, the buffer layer 34 may include monocrystalline silicon. Selective epitaxial growth of the monocrystalline silicon may use a silicon source selected among DCS (dichlorosilane), TCS (trichlorosilane) or $SiH_4$. Furthermore, selective epitaxial growth may be performed in an HCl atmosphere under 1 Torr to an atmospheric pressure at 600~1,200° C.

Before forming the buffer layer 34, baking may be performed. Baking may be performed in a hydrogen atmosphere. By performing baking process, passivation of surfaces on which the buffer layer 34 is to be formed and removal of a native oxide may be ensured. Baking process in the hydrogen atmosphere is performed at 800~1,200° C.

Referring to FIG. 4L, a first conductive layer 35 is formed on the entire surface of the resultant structure formed with the buffer layer 34. The first conductive layer 35 includes a metal-containing substance capable of silicidation. The first conductive layer 35 includes any one selected among cobalt (Co), titanium (Ti), tantalum (Ta), nickel (Ni), tungsten (W), platinum (Pt) and palladium (Pd). The first conductive layer 35 is formed using chemical vapor deposition (CVD) or atomic layer deposition (ALD). The deposition thickness of the first conductive layer 35 may include a thickness capable of allowing full silicidation in a subsequent silicidation process.

Referring to FIG. 4M, annealing 36 is performed to result in silicidation in which the first conductive layer 35 and the bodies 24 react with each other. Since the first conductive layer 35 is a metal and the substances of the bodies 24 and the buffer layer 34 contain silicon, a metal silicide 37 is formed by the reaction of the first conductive layer 35, the bodies 24 and the buffer layer 34. The metal silicide 37 includes any one selected among a cobalt silicide, a titanium silicide, a tantalum silicide, a nickel silicide, a tungsten silicide, a platinum silicide and a palladium silicide. The annealing 36 includes rapid thermal annealing (RTA). The rapid thermal annealing (RTA) may be performed at different temperatures depending upon the kinds of the bodies 24, the buffer layer 34 and the first conductive layer 35. For example, in the case that the first conductive layer 35 is formed using cobalt (Co), an annealing temperature range may be 400° C. to 800° C. The metal silicide 37 may be formed to have a fully silicided (FUSI) structure. By sufficiently performing silicidation on both sidewalls of the bodies 24, the portions of the bodies 24 are fully silicided. Through full silicidation, the metal silicide 37 is formed in the bodies 24.

After forming the metal silicide 37, an unreacted first conductive layer 35A remains. The metal silicide 37, which is formed through the silicidation process as described above, becomes buried bit lines (BBL). The metal silicide 37 becomes buried bit lines having the shapes which are buried in the bodies 24.

According to the above descriptions, due to the fact that the silicidation process is performed with the buffer layer 34 formed, a change of the metal silicide 37 may be maximally suppressed. Furthermore, a CD change of the metal silicide 37 may be controlled to the minimum due to the presence of the buffer layer 34, and accordingly, the metal silicide 37 may be prevented from being cut through flocculation.

Since the silicidation process is performed on the buffer layer 34, structural stability is improved, and the entire structures are prevented from leaning. Also, as the buffer layer 34 is silicided, the CD of the bodies 24 may be increased to reduce the resistance of the metal silicide 37.

Hereinafter, the metal silicide 37 is referred to as buried bit lines 37.

Referring to FIG. 4N, the unreacted conductive layer 35A is removed. The unreacted conductive layer 35A may be removed through wet etching.

Meanwhile, in the case that the first conductive layer 35 is formed using cobalt, in order to form a cobalt silicide, rapid thermal annealing (RTA) is performed at least twice. For example, primary annealing and secondary annealing are performed. The primary annealing is performed at a temperature of 400° C. to 600° C., and the secondary annealing is performed at a temperature of 600° C. to 800° C. By the primary annealing, a cobalt silicide with the phase of $CoSi_x$ (x=0.1~1.5) is formed. By the secondary annealing, a cobalt silicide with the phase of $CoSi_2$ is obtained. Among cobalt silicides, the cobalt silicide with the phase of $CoSi_2$ has smallest specific resistance. Unreacted cobalt is removed between the primary annealing and the secondary annealing. The unreacted cobalt may be removed using a mixed chemical of sulphuric acid ($H_2SO_4$) and hydrogen peroxide ($H_2O_2$)

Referring to FIG. 4O, an interlayer dielectric layer 38 is formed on the entire surface of the resultant structure in such a way as to gap-fill the trenches 23. The interlayer dielectric layer 38 may include an oxide such as BPSG. The interlayer dielectric layer 38 may planarized such that the surface of the hard mask layer 22 is exposed.

FIGS. 5A to 5E are cross-sectional views illustrating a method for fabricating a semiconductor device including the buried bit lines in accordance with the embodiment of the present invention. FIGS. 5A to 5E are cross-sectional views taken along the line C-C' of FIG. 4O.

Figure 5A:
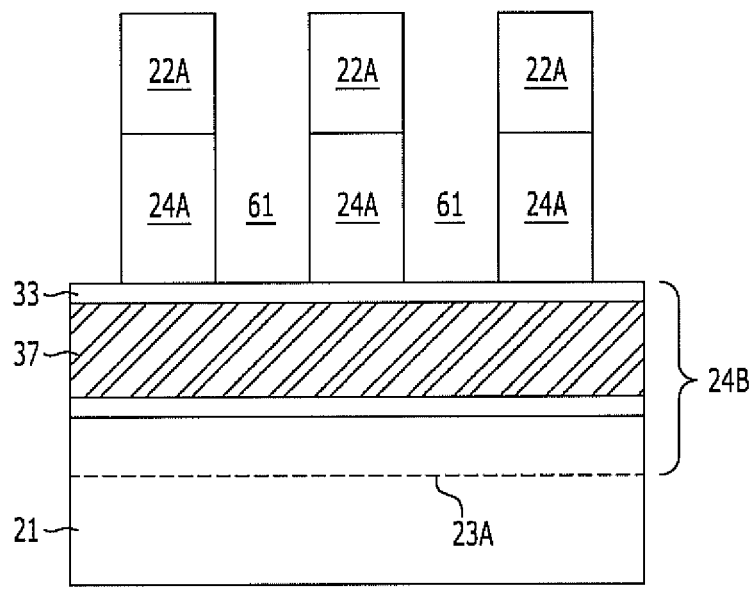
FIGS. 5A to 5E are cross-sectional views illustrating a method for fabricating a semiconductor device including the buried bit lines in accordance with the exemplary embodiment of the present invention.

Referring to FIG. 5A, word line trenches 61 are defined. An unillustrated photoresist pattern is used for defining the word line trenches 61. The hard mask layer 22 is etched using the photoresist pattern as an etch mask. Successively, the upper portions of the bodies 24 are etched by a given depth. While not shown in the cross-sectional view taken along the line C-C' of FIG. 4O, the interlayer dielectric layer 38 (see FIG. 4O) may be etched by the given depth as well.

By etching the upper portions of the bodies 24 in this way, pillars 24A are formed on the bodies 24B. The bodies 24B and the pillars 24A become active regions. The bodies 24B are separated by the trenches 23 and have the forms of lines which extend in the same direction as the buried bit lines 37. The pillars 24A vertically extend from the bodies 24. The pillars 24A are formed as the unit of cell. Accordingly, a plurality of pillars 24A are formed on one body 24B and are separated from one another by the word line trenches 61. The depth of the word line trenches 61 may have a dimension that does not expose the buried bit lines 36. The reference numeral 23A designates the bottoms of the trenches 23 (see FIG. 4O).

The pillars 24A have structures in which the source/drain regions and the channel regions of vertical channel transistors are formed. The plurality of pillars 24A may have the layout of a matrix type array on the bodies 24B.

Figure 5B:
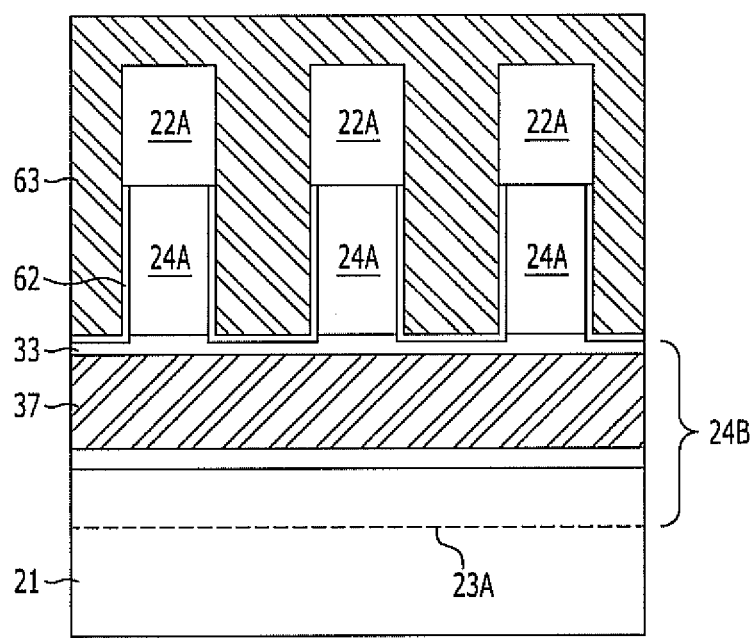

Referring to FIG. 5B, a second conductive layer 63 is formed to gap-fill the word line trenches 61. A gate dielectric layer 62 may be formed before forming the second conductive layer 63. The gate dielectric layer 62 may be formed by oxidating the sidewalls of the pillars 24A and the upper surfaces of the bodies 24B. The second conductive layer 63 uses a low resistance substance. For example, a metallic layer may be used. The metallic layer may include a titanium layer, a titanium nitride layer, a tungsten layer, and so forth.

Figure 5C:
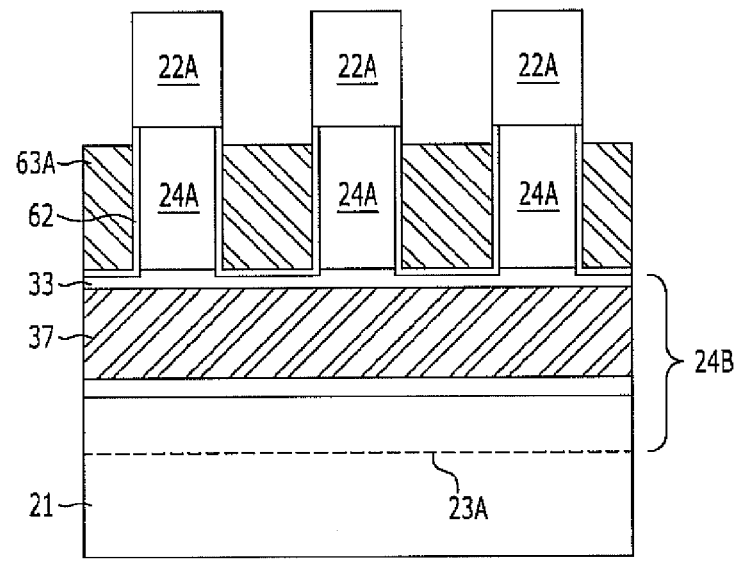

Referring to FIG. 5C, by sequentially performing planarization and etch-back for the second conductive layer 63, a recessed second conductive layer 63A remains.

Figure 5D:
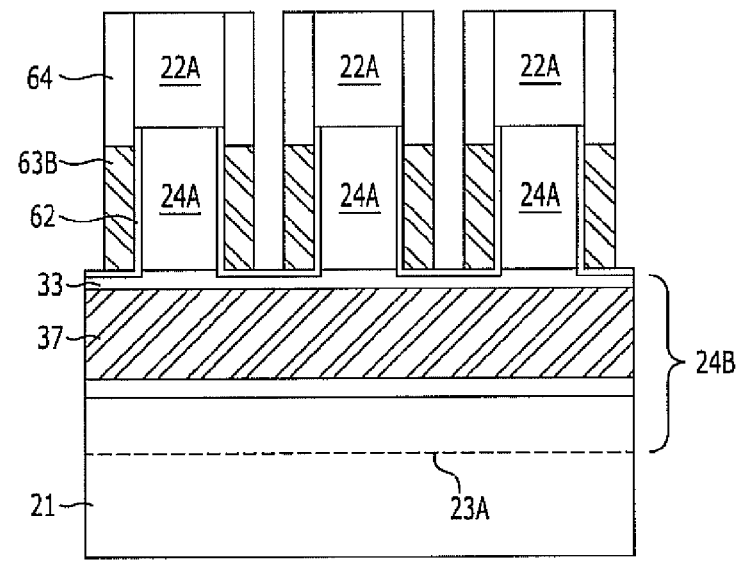

Referring to FIG. 5D, by depositing and etching back a dielectric layer, spacers 64 are formed. The spacers 64 may include a nitride layer.

The second conductive layer 63A is etched using the spacers 64 as an etch barrier. Therefore, vertical word lines 63B are formed on both sidewalls of the pillars 24A. The vertical word lines 63B also serve as vertical gate electrodes. In another embodiment, the vertical word lines 63B may be formed to surround the pillars 24A. In still another embodiment, after forming annular vertical gate electrodes surrounding the pillars 24A, vertical word lines 63A may be formed in such a way as to connect adjacent vertical gate electrodes with each other. The vertical word lines 63B are formed to extend in a direction crossing with the buried bit lines 37.

Figure 5E:
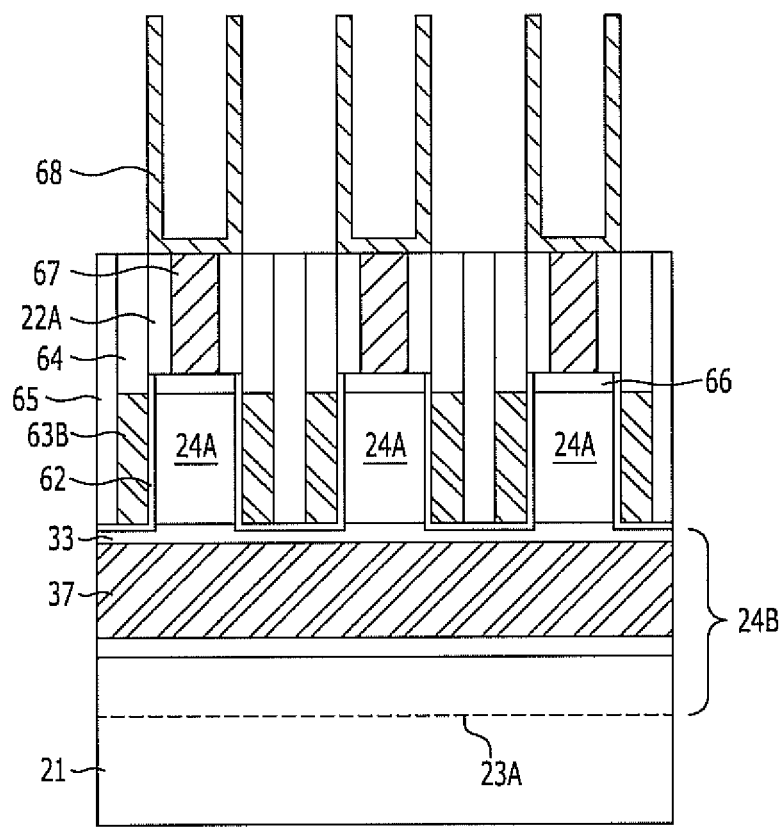

Referring to FIG. 5E, a word line isolation layer 65 for isolating the vertical word lines 63B from one another is formed. The word line isolation layer 65 includes a dielectric layer such as an oxide layer. The word line isolation layer 65 may be formed by forming a dielectric layer on the entire resultant structure formed with the vertical word lines 63B and then planarizing the dielectric layer.

By performing storage node contact etching, the upper surfaces of the active pillars 24A are exposed. Thereafter, storage node contact (SNC) plugs 67 are formed. Before forming the storage node contact plugs 67, second source/drain regions 66 may be formed by performing ion implantation. The second source/drain regions 66 may be formed by adopting an ion implantation method generally known in the art. Accordingly, the pillars 24A may include the second source/drain regions 66 and vertical channel regions. The vertical channel regions are formed between the first source/drain regions 33 and the second source/drain regions 66. The second source/drain regions 66 may be connected with capacitors. The first source/drain regions 33, the vertical channel regions and the second source/drain regions 66 may be connected with one another in the vertical direction. The first source/drain regions 33 and the second source/drain regions 66 may form NPN junctions or PNP junctions in cooperation with the vertical channel regions. For example, in the case that the first source/drain regions 33 and the second source/drain regions 66 are doped with impurities of a first conductivity type, the vertical channel regions may be doped with impurities of a second conductivity type opposite to the first conductivity type. That is, when the impurities of the first conductivity type are N type impurities, the impurities of the second conductivity type include P type impurities. Conversely, when the impurities of the first conductivity type are P type impurities, the impurities of the second conductivity type include N type impurities. When the vertical channel transistors are NMOSFETs, the first source/drain regions 33, the vertical channel regions and the second source/drain regions 66 may form NPN junctions.

Capacitors are formed on the storage node contact plugs 67. The capacitors include storage nodes 68. The storage nodes 68 may have the shapes of cylinders. In another embodiment, the storage nodes 68 may have the shapes of pillars or concaves. While not shown in a drawing, a dielectric layer and top electrodes are subsequently formed.

The semiconductor device in accordance with the embodiment of the present invention may be included in a memory cell and a memory cell array. Bit lines and word lines may store or output data on the basis of voltages applied by a column decoder and a row decoder which are connected with the memory cell array.

The memory cell array according to the embodiment of the present invention may be included in a memory device. The memory device may include a memory cell array, a row decoder, a column decoder and sense amplifiers. The row decoder selects a word line corresponding to a memory cell for which a read operation or a write operation is to be performed, among the word lines of the memory cell array, and outputs a word line select signal to the memory cell array. The column decoder selects a bit line corresponding to a memory cell for which a read operation or a write operation is to be performed, among the bit lines of the memory cell array, and outputs a bit line select signal to the memory cell array. The sense amplifiers sense the data stored in the memory cells which are selected by the row decoder and the column decoder.

The memory device according to the embodiment of the present invention may be applied to a DRAM (dynamic random access memory), and it is not limited to such and may also be applied to an SRAM (static random access memory), a flash memory, an FeRAM (ferroelectric random access memory), an MRAM (magnetic random access memory), a PRAM (phase change random access memory), etc.

The main product groups of the memory device may be applied not only to computing memories used in a desktop computer, a notebook computer and a server but also to graphics memories of various specifications and mobile memories which recently gain popularities with the development of mobile communication. Also, the memory device may be provided not only in a portable storage medium such as a memory stick, an MMC, an SD, a CF, an xD picture card and a USB flash device but also in various digital applications such as an MP3P, a PMP, a digital camera, a camcorder and a mobile phone. Furthermore, the memory device may be applied not only to a single semiconductor device but also to technical fields including an MCP (multi-chip package), a DOC (disk on chip) and an embedded device. Moreover, the memory device may be applied to a CIS (CMOS image sensor) and may be provided in various fields such as of a camera phone, a web camera and a small photographing device for a medical use.

The memory device according to the embodiment of the present invention may be used in a memory module. The memory module includes a plurality of memory devices mounted to a module substrate, a command link configured to allow the memory devices to receive control signals (an address signal, a command signal and a clock signal) from an external controller, and a data link connected with the memory devices and configured to transmit data. The command link and the data link may be formed similarly to those used in a general memory module. In the memory module, eight memory devices may be mounted to the front surface of the module substrate, and memory devices may be mounted the same to the back surface of the module substrate. That is to say, memory devices may be mounted to one side or both sides of the module substrate, and the number of mounted memory devices is not limited. In addition, the substance and the structure of the module substrate are not specifically limited.

The memory module according to the embodiment of the present invention may be used in a memory system. The memory system includes a controller which provides a bidirectional interface between at least one memory module to which a plurality of memory devices are mounted and an external system and is configured to control the operation of the memory module.

The memory system according to the embodiment of the present invention may be used in an electronic unit. The electronic unit includes a memory system and a processor electrically connected therewith. The processor includes a CPU (central processing unit), an MPU (micro processor unit), an MCU (micro controller unit), a GPU (graphics processing unit) or a DSP (digital signal processor). The CPU or MPU has a combined form of an ALU (arithmetic logic unit) as an arithmetic logic operation unit and a CU (control unit) for reading and analyzing a command and controlling respective units. When the processor is the CPU or the MPU, the electronic unit may include a computer instrument or a mobile instrument. The GPU as a CPU for graphics is a processor for calculating numbers with decimal points and showing graphics in real time. When the processor is the GPU, the electronic unit may include a graphic instrument. The DSP is a processor for converting an analog signal (for example, voice) into a digital signal at a high speed and using a calculation result or converting a digital signal into an analog signal. The DSP mainly calculates digital values. When the processor is the DSP, the electronic unit may include a sound and image instrument. Besides, the processor includes an APU (accelerate processor unit) being a processor which has a combined form of CPU and GPU and includes the role of a graphic card.

As is apparent form the above descriptions, according to the embodiment of the present invention, since buried bit lines which are brought into direct contact with lower portions of pillars are formed through a double-side-contact process and a full silicidation process, parasitic capacitance between adjacent buried bit lines may be reduced.

Furthermore, according to the embodiment of the present invention, because a metal silicide is adopted as the substance of the buried bit lines, the sheet resistance (Rs) of the buried bit lines may be decreased.

Moreover, according to the embodiment of the present invention, a CD change of the buried bit lines may be minimized due to the presence of a buffer layer, and thus, the buried bit lines may be prevented from being cut through flocculation.

In addition, according to the embodiment of the present invention, because the buffer layer passes through the silicidation process, structural stability is increased, and the occurrence of leaning is prevented. Also, because the CD of the buried bit lines increases, the resistance of the buried bit lines may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming at least one body having two sidewalls by etching a semiconductor substrate;
    forming a protective layer having open parts that expose portions of the both sidewalls of the body;
    forming a buffer layer that fills the open parts; and
    forming a buried bit line in the body by siliciding the buffer layer and a portion of the body between the buffer layer,
    wherein the forming of the buried bit line comprises:
        forming a conductive layer over an entire surface including the buffer layer; and
        performing annealing to silicide the conductive layer, the buffer layer and the body.

2. The method of claim 1, wherein the forming of the buffer layer includes forming the buffer layer using epitaxial growth.

3. The method of claim 1, wherein the forming of the buffer layer includes forming a monocrystalline silicon layer through selective epitaxial growth.

4. The method of claim 1, further comprising
    performing a baking process onto surfaces of the exposed portions of the both sidewalls of the body before the forming of the buffer layer.

5. The method of claim 4, wherein the performing of the baking process is implemented in a hydrogen atmosphere.

6. The method of claim 1, wherein the forming of the buried bit line comprises:
    forming a cobalt layer;
    forming a cobalt silicide by performing annealing; and
    removing the cobalt layer.

7. The method of claim 1, wherein the forming of the protective layer comprises:
    forming a first protective layer over an entire surface including the body;
    forming a second protective layer having a different etching selectivity from the first protective layer on lower portions of the both sidewalls of the body;
    forming a third protective layer having a different etching selectivity from the first protective layer on upper portions of the both sidewalls of the body; and
    selectively removing the first protective layer exposed between the second and third protective layers.

8. The method of claim 1, further comprises:
    performing plasma doping on the exposed portions of the both sidewalls of the body to form a first source or drain region before the forming of the buffer layer.

9. A method for fabricating a semiconductor device, comprising:
    etching a silicon substrate and forming a plurality of silicon bodies that each have a burial region;
    forming a protective layer having open parts that expose both sidewalls of the burial regions of the silicon bodies;
    forming a silicon-containing buffer layer that fills the open parts;
    forming a metal-containing layer over entire surfaces of the silicon bodies including the silicon-containing buffer layer;
    forming a metal silicide layer in the burial regions of the silicon bodies by fully siliciding the silicon-containing buffer layer and the burial regions;
    removing the metal-containing layer; and
    forming a dielectric layer that gap-fills spaces between the plurality of silicon bodies.

10. The method of claim 9, wherein the forming of the silicon-containing buffer layer includes forming a monocrystalline silicon layer through selective epitaxial growth.

11. The method of claim 9, wherein the metal silicide layer comprises a cobalt silicide layer.

* * * * *